(12) United States Patent
Barsumian et al.

(10) Patent No.: US 10,499,353 B2
(45) Date of Patent: *Dec. 3, 2019

(54) DATA MANAGEMENT WITH SPECTRUM ANALYZERS

(71) Applicant: Research Electronics International, LLC., Cookeville, TN (US)

(72) Inventors: Bruce R. Barsumian, Cookeville, TN (US); Thomas H. Jones, Cookeville, TN (US); Ross Alan Binkley, Cookeville, TN (US)

(73) Assignee: Research Electronics International, LLC, Cookeville, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/444,678

(22) Filed: Feb. 28, 2017

(65) Prior Publication Data

US 2017/0170917 A1 Jun. 15, 2017

Related U.S. Application Data

(63) Continuation-in-part of application No. 14/677,167, filed on Apr. 2, 2015, now Pat. No. 9,618,549.

(60) Provisional application No. 61/974,190, filed on Apr. 2, 2014.

(51) Int. Cl.
*H04W 56/00* (2009.01)
*G01R 31/319* (2006.01)
*G01R 23/16* (2006.01)
*G01R 31/302* (2006.01)
*G01R 31/3193* (2006.01)
*H04W 84/20* (2009.01)

(52) U.S. Cl.
CPC ............ *H04W 56/00* (2013.01); *G01R 23/16* (2013.01); *G01R 31/3025* (2013.01); *G01R 31/31907* (2013.01); *G01R 31/31937* (2013.01); *H04W 84/20* (2013.01)

(58) Field of Classification Search
CPC ................ G01R 23/16; G01R 31/3025; G01R 31/31907; G01R 31/31937; H04W 56/00; H04W 84/20
USPC ...................................................... 455/67.7
See application file for complete search history.

(56) References Cited

U.S. PATENT DOCUMENTS 9,618,549 B2 * 4/2017 Barsumian ............. G01R 23/16
2012/0027055 A1 * 2/2012 Lang .................. H04B 7/18515
375/219

(Continued)

*Primary Examiner* — Eugene Yun
(74) *Attorney, Agent, or Firm* — Hornkohl Intellectual Property Law, PLLC; Jason L. Hornkohl

(57) ABSTRACT

A spectrum analyzer contains a number of improvements that adapt it to common commercial uses. The spectrum analyzer is capable of automatically wirelessly receiving and synchronizing frequency spectrum data collected from multiple remote spectrum analyzers with respect to frequency, time and location. A selector function is used to create composite frequency data sets from multiple frequency data sets while allowing retroactive identification and examination of the original frequency data. An improved non-linear graphical display of the frequency spectrum data is created by automatically expanding the resolution of frequency axis for frequency ranges having signals of interest and contracting the resolution of the frequency axis of frequency ranges having no signals of interest.

20 Claims, 14 Drawing Sheets

(56) References Cited

U.S. PATENT DOCUMENTS

| | | | |
|---|---|---|---|
| 2012/0056822 A1* | 3/2012 | Wilson | G06F 3/0418 345/173 |
| 2013/0230131 A1* | 9/2013 | Moore | H04B 1/0032 375/350 |
| 2014/0028577 A1* | 1/2014 | Krah | G06F 3/0416 345/173 |

* cited by examiner

DATA MANAGEMENT WITH SPECTRUM ANALYZERS

CROSS-REFERENCES TO RELATED APPLICATIONS

The present application is a continuation-in-part of and claims priority from co-pending U.S. patent application Ser. No. 14/677,167 filed Apr. 2, 2015 which claimed priority from Provisional Patent Application No. 61/974,190 entitled "Spectrum Analyzer" filed Apr. 2, 2014, all of which are hereby incorporated by reference.

STATEMENT REGARDING FEDERALLY SPONSORED RESEARCH OR DEVELOPMENT

Not Applicable.

REFERENCE TO SEQUENCE LISTING OR COMPUTER PROGRAM LISTING APPENDIX

Not Applicable.

BACKGROUND OF THE INVENTION

Frequency spectrum analyzers are common products with a broad range of commercial applications. Examples of such applications include, but are not limited to, commercial RF technologies such as AM, Cellular, PCS, DCS. 2G, 3G, 4G, LTE, CDMA, cdmaOne, CDMA 2000, W-CDMA/CDMA, 1xEV-DO, DECT phones, GSM, GPRS, EDGE, FM, UMTS, HSDPA, W-CDMA, TDMA, AMPS as well as 802.11, Bluetooth, Broadcast, Emergency, Fire, GPS, HDTV, IBOC, In-Building, Microwave, NPSPAC, Paging, Police, Private radio, Project 25, Public, RADAR, Safety, Telematics, TETRA, Trunking, UMTS, Utilities, WiMAX, Wi-Fi, WLAN and WLL. Spectrum analyzers are used to perform a wide variety of tasks that can occur in connection with these commercial RF applications such as installation, maintenance, troubleshooting, antenna alignment, RF measurements for radio and TV broadcasting, mobile phone base station radiation power density measurements, magnetic interference or leakage from motors and/or miscellaneous machinery, testing of wiring for RF energy, electromagnetic field strength measurement for various EMC limits, and cellular/cordless phone radiation levels.

Additional examples of the commercial use of spectrum analyzers during everyday tasks include searching for unknown RF transmissions, FCC compliance, monitoring blasting sites, identifying RF interference impacting communications systems, security surveys for corporate board rooms, VIP protection, protection of intellectual property, detection and location of magnetic fields, and detection of signal interference and undesired RF emissions from medical equipment.

Universities, community colleges, vocational schools, and high schools also use spectrum analyzers for educational labs and research. There is a similar demand from small start-up companies, hobbyists and individual inventors for a low cost spectrum analyzer that they can use in developing and exploring new product innovations. Spectrum analyzers are also often used in the home to address personal living environment RF safety concerns.

Unfortunately, many currently available spectrum analyzers are very expensive, overly complicated to use, primarily adapted to sophisticated engineering use and generally ill-suited to perform more common commercial tasks for which they are commonly used. Therefore, what is needed is a low cost spectrum analyzer that is easy to use and adapted to the needs of the commercial user.

Also, there are many applications that would benefit from an in place spectrum analyzer that could be monitored from a remote location. This is currently available in many commercial spectrum analyzers using wired methods, but it would be beneficial to have a remote spectrum analyzer that could be monitored using remote wireless means.

BRIEF SUMMARY OF THE INVENTION

The present invention is directed toward improvements in the operation of commercial spectrum analyzers. More particularly, an embodiment of the invention is directed toward a method of displaying frequency data from multiple data sets or multiple devices in a simple and concise manner. In accordance with the method, a first set of frequency spectrum data points is collected with the spectrum analyzer. A second set of frequency spectrum data points is then collected with the spectrum analyzer. Using the frequency of each data point, the two data sets are aligned so that points from the first data set at each frequency are aligned with points on the second data set that have the same frequency. A selector function is then applied to each of the first set of data points and the corresponding second set of data points. The selector function designates either the data point from the first set of data or the corresponding second set of data. In a preferred embodiment, the selector function designates a data point as a selected data point based upon which one has the largest signal amplitude. A composite data set of the selected data points is formed by retaining the origin of each data point in the selected data set. The composite data set is then displayed. Using this method, composite data sets can be created from multiple data sets with the original data sets coming from different spectrum analyzers or from the same spectrum analyzer taken at different locations or different times. Composite data sets can also be created from two or more composite data sets. Each data point in the composite data set retains the identity of its source data, such that the user would be able to determine which source data set any point in the composite data set came from.

Another embodiment of the present invention is directed toward a method of operating and monitoring data on a plurality of frequency spectrum analyzers. In accordance with the method, a computer or spectrum analyzer is designated as a master controller device. One or more spectrum analyzers are then designated as slave devices and a communication link is established between the controller device and the slave devices. Frequency spectrum data is then collected with the slave spectrum analyzers and transmitted to the master device. In addition, other types of spectrum analyzer data can also be transmitted such as I&Q data and/or signal list information. The master device displays a composite data set created from the spectrum data sets from the spectrum analyzers. The master device can be connected to the slave devices by Ethernet or by a proprietary wireless communications protocol. There are infinite possibilities with regard to wireless protocols but one possible embodiment of the proprietary wireless standard is based on traditional Wi-Fi technology which is used to transmit data from the slave devices to the master device using information packets. Also, modern communications data compression techniques or algorithms may be used to minimize data volume for improved communications. For example, one such algorithm would consist of only transmitting data associated with a specified signal level threshold which would greatly reduce data volume. Furthermore, there are many ways to deal with the fact that a spectrum analyzer that is sweeping the frequency spectrum and will inadvertently capture RF energy associated with the wireless communications between analyzers. Preferably, to not corrupt the monitored RF spectrum, the wireless transmission is halted while the spectrum analyzers collect spectrum data so that the wireless transmission does not appear in the collected spectrum data. In this communications scenario, the master/slave communication is interleaved and synchronized with the spectrum analyzer sweeping functions so that the spectrum analyzers may monitor the true frequency spectrum without detecting the master/slave communications. In another method, the spectrum analyzer may continue sweeping and the spectrum analyzer simply ignore the data associated with times and/or frequency ranges where the spectrum analyzer is detecting its own wireless communications. This method provides the advantage of not having to coordinate synchronization and reestablishment of the communications activity while maintaining a much higher update rate of the bulk of the RF spectrum. Also, using this approach, the communications may be halted periodically to allow the spectrum analyzer to sweep the associated communications frequency range without corruption for comparison. In summary, there are many approaches and algorithms that may be implemented to accomplish wireless communications while maintaining an RF sweep of the spectrum. The chosen algorithm will depend on many factors including the sweep speed, frequency resolution, data volume, data compression, and desired update rate.

Yet another embodiment of the present invention is directed toward a method of producing a non-linear frequency display for a frequency spectrum analyzer. When using a spectrum analyzer to view a wide frequency span, there is often a very large range of frequencies where no signals exist. A more useful display provides increased visibility of areas in the frequency spectrum with more densely populated signals while providing less visibility for areas of the spectrum where no signals exist. In accordance with the method, a frequency spectrum trace in a specified frequency span is captured with a spectrum analyzer. Frequency ranges in the specified frequency span having signal levels or data points above a specified amplitude threshold level are then identified. An output display is produced having a frequency axis wherein frequency ranges having a high concentration of signals are graphical expanded more than frequency ranges not having a high concentration of signals. This algorithm is preferably based on the total RF energy measured over a specified frequency range. Hence, when viewing a large portion of the frequency spectrum on a spectrum analyzer, the normal frequency spectrum display is replaced with a non-linear frequency spectrum axis display which provides greater visibility of densely populated areas of the frequency spectrum. When the user zooms in to desired portions of the spectrum, the non-linear display effect can be reduced or completely removed so that that power spectral density of individual signals is not distorted because of the non-linear display effect. This non-linear display effect may be implemented using normal line type graphing, or, in another embodiment, bar graphs may be used to represent the density of spectrum. In the bar graph embodiment, each bar graph may represent a different span of frequency spectrum based on the density of the signals within that span with the amplitude of the bar graph representing the peak or average of the signals within that span. And finally, the non-linear displays may be used to represent the composite traces previously described for an improved method of rapidly viewing the frequency spectrum generated from multiple data sets.

DETAILED DESCRIPTION OF THE INVENTION

Figure 1:
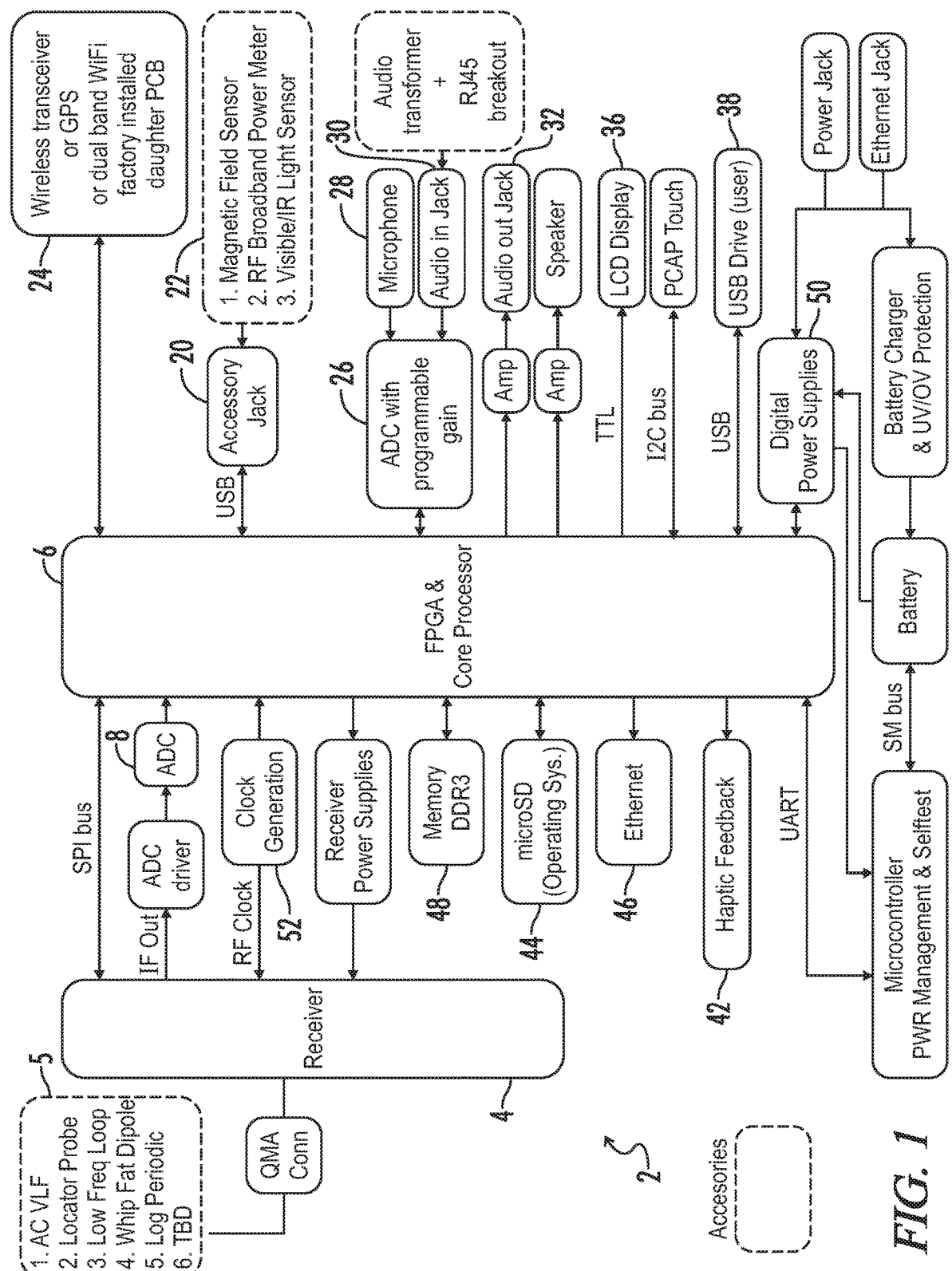
FIG. 1 is a system block diagram of a spectrum analyzer constructed in accordance with an embodiment of the present invention.

Referring now to FIG. 1, a system block diagram of the electrical components of a spectrum analyzer 2 constructed in accordance with embodiment of the present invention is shown. The main components are a receiver 4 that receives and processes signals from the environment and a field programmable gate array 6 with an internal processor that performs the required processing and manages the various components of the analyzer.

The receiver 4 detects the signals received by the antenna 5 of the spectrum analyzer 2. The output of the receiver 4 is digitized by a digital to analog converter 8 and read by the field programmable gate array 6. A wireless transceiver and GPS circuitry 24 connected to the gate array 6 provides the analyzer 2 with digital communication and location capabilities. The OPS transceiver module 24 is beneficial in that it allows the spectrum analyzer 2 to store location information along with the associated frequency data.

The gate array 6 controls an LCD Display 36, a USB port 38 for the purpose of connecting storage, operating system memory 44, internal memory 48 and Ethernet circuitry 46. A haptic feedback motor 42 under control of the gate array 6 provides tactile feedback through vibration. An analog to digital converter 26 is used to connect the gate array 6 to series of audio input/outputs including a microphone 28 and audio in jack 30. An audio out jack 32 and speaker 34 connect directly to the gate array 6. Power 50 and clock signal 52 circuits are connected to the gate array 6 to power and synchronize the circuitry of the analyzer 2.

The field programmable gate array 6 is connected to an accessory jack 20 that is used to couple the analyzer 2 to attachable accessories 22 such as a magnetic field sensor, acoustic sensors, RF broadband power meter or visible or infrared light sensors. A magnetic field sensor allows the analyzer to be used to monitor magnetic interference or leakage from motors, generators, or misc. machinery. Light transmissions are detected through light meters and light probes that can be attached to the device as accessories. Accessories are also provided for the measurement and detection of acoustic or ultrasonic mechanical vibrations and the testing of wiring for acoustic or RF energy. These accessories can be easily coupled to the device through the accessory jack 20 or other input/output ports.

Figure 2:
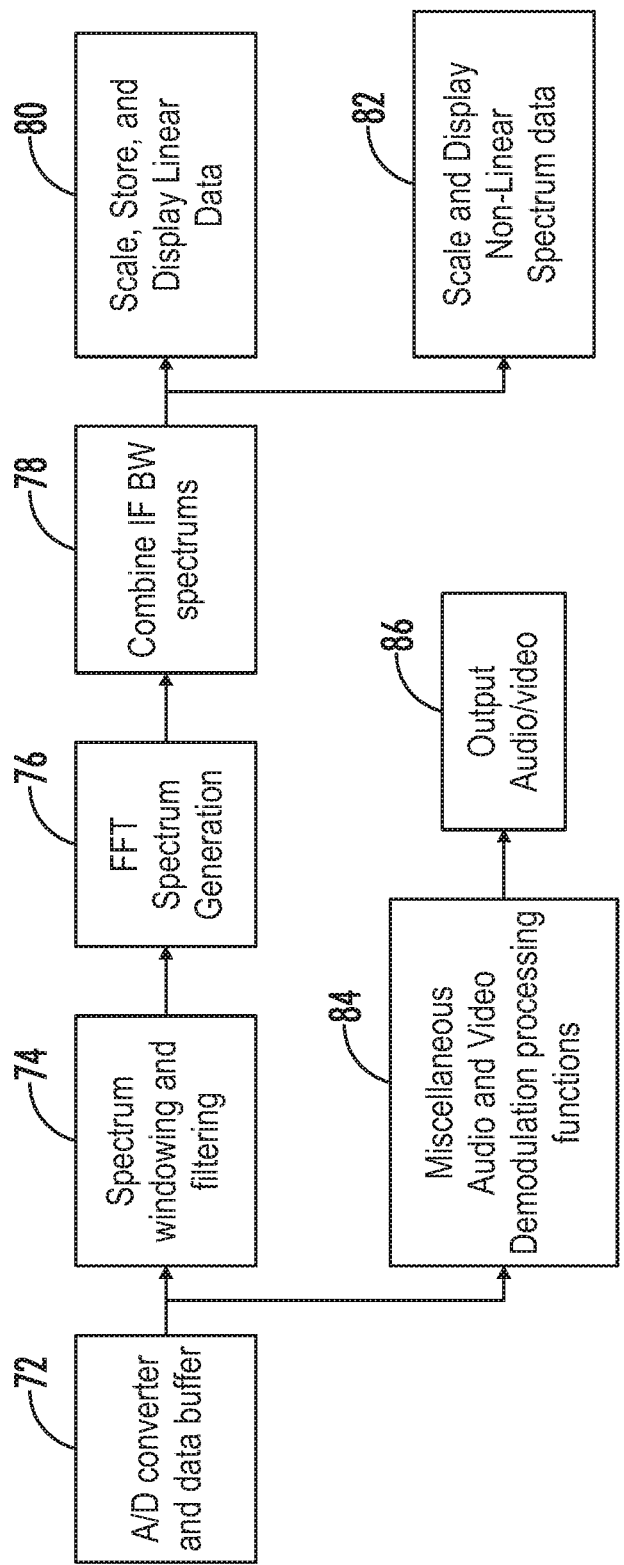
FIG. 2 is a block diagram of the logic of the gate array of the spectrum analyzer of FIG. 1.

Referring now to FIG. 2, a block diagram of the signal processing of the spectrum analyzer of FIG. 1 is shown. The digitized signal from the analog to digital converter 8 is processed in a data acquisition buffer 72. A window function 74 is used to limit the frequency span of the data. A Fast Fourier Transform 76 is performed on the frequency data in the selected window. Combining and performing overlap correction 78 is performed on the multiple spectrums produced from each instantaneous block of frequency and spectral data power levels are calculated and written to memory 80 for display. The spectral data may be displayed with a non-linear frequency axis to enhance viewing of densely populated areas of the spectrum 82.

The raw signal data from the analog to digital converter is also used to produce an audio output 84. The gate array includes circuitry 86 that captures and saves the raw frequency data and transformed audio or video data used to produce the audio or video output 86.

Figure 3:
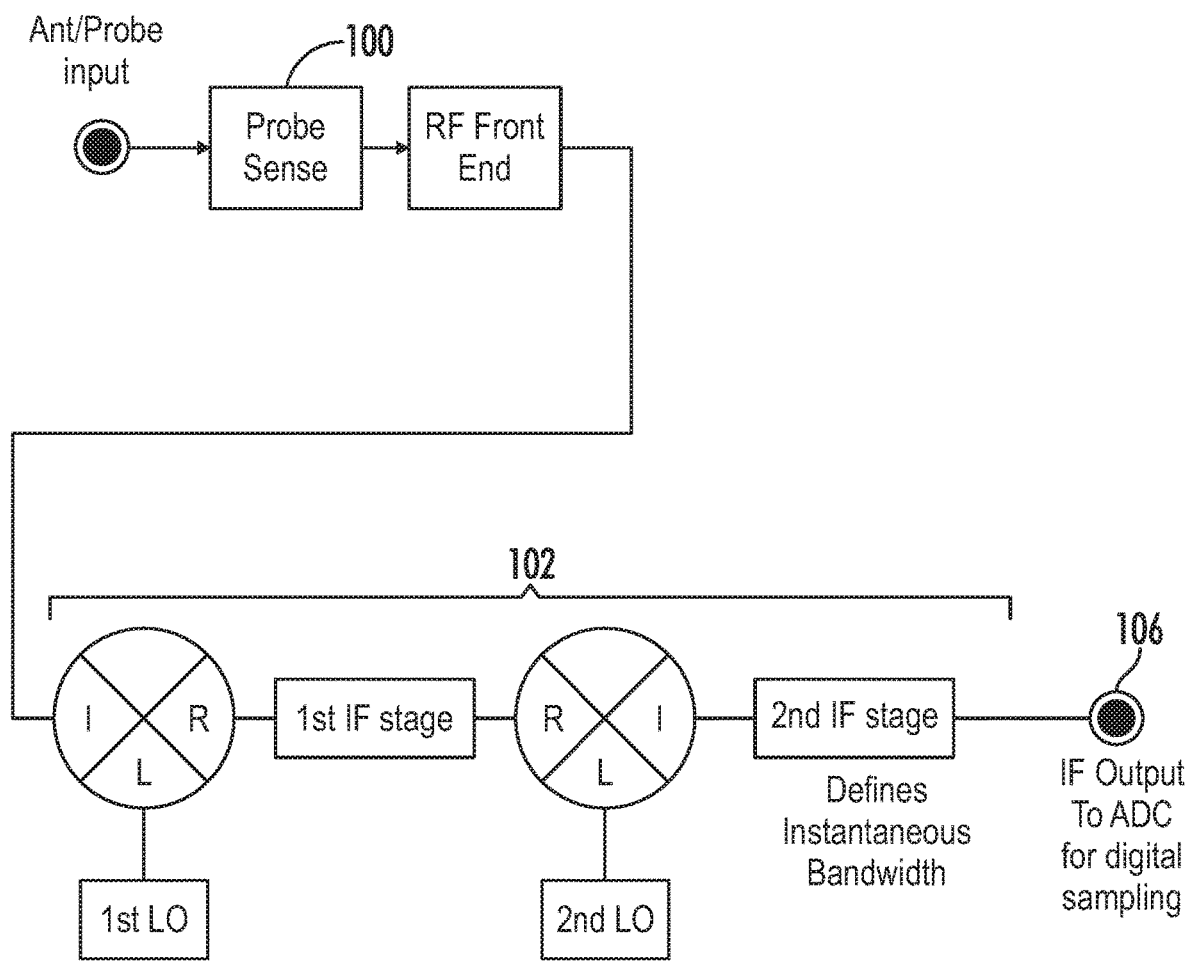
FIG. 3 is a block diagram of the receiver 4 of the spectrum analyzer of FIG. 1.

FIG. 3 is a block diagram of the receiver 4 of the spectrum analyzer of FIG. 1. The spectrum analyzer typically contains receiver hardware to cover a broad frequency range typically greater than 1 GHz and has various related probes and antennas that can be connected to the receiver input circuitry 100. The front end circuitry contains a receiver that is capable of down-converting portions of the frequency spectrum to an (IF) intermediate frequency. The IF bandwidth determines the maximum instantaneous frequency bandwidth that the receiver is capable of processing at an instance in time. The output of the IF bandwidth filter is then sampled using an analog to digital converter and the remaining analysis is done using digital processing techniques. In the embodiment of this invention, the receiver includes a double super-heterodyne receiver path 102 that down converts frequencies in the range from 10 kHz to 6 GHz to an intermediate frequency with a bandwidth of 25 MHz. The output of the receiver 106 is an IF signal that gets sampled by an analog to digital converter and provided to the gate array of the analyzer, where a Fast Fourier Transform is performed on the data to produce an output frequency spectrum. For broadband sweeping, the frequency resolution is preferably fixed so that standardized data files can be compared using the same frequency resolution.

Figure 4A:
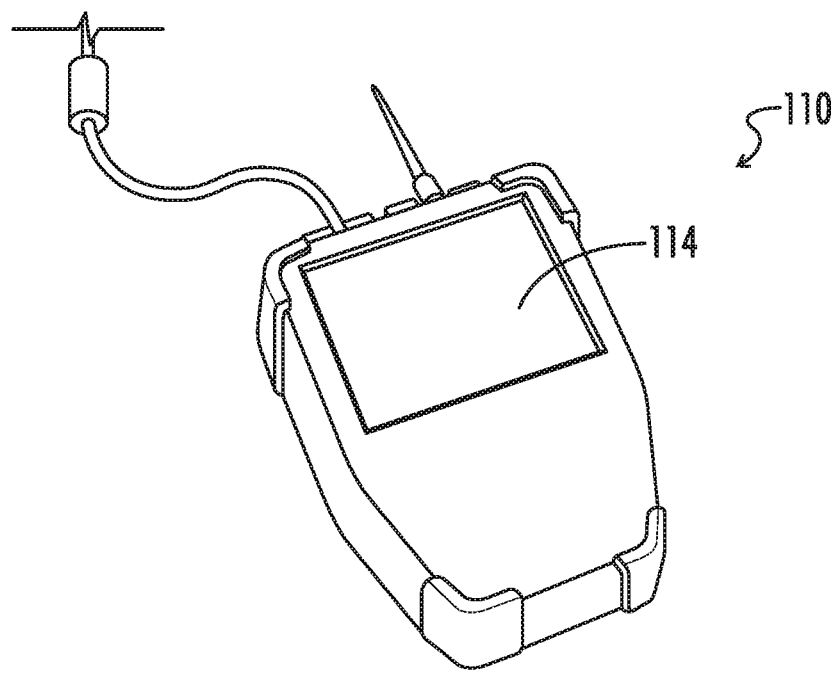
FIGS. 4(A) and 4(B) are illustrations of the exterior housings of spectrum analyzers constructed in accordance with preferred embodiments of the present invention.
Figure 4B:
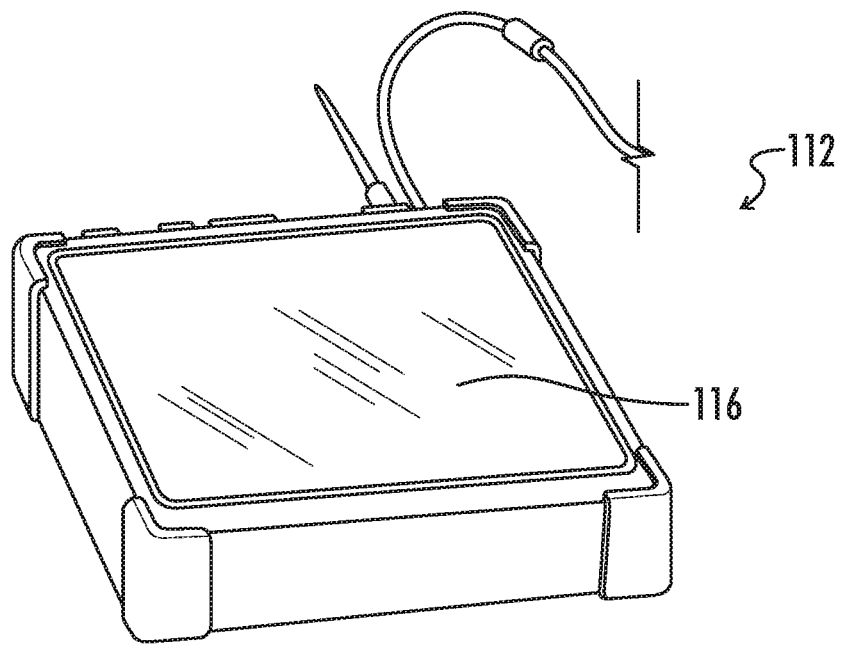

Referring now to FIGS. 4(A) and 4(B), illustrations of the exterior housings of two preferred spectrum analyzers 110 and 112 constructed in accordance with preferred embodiments of the present invention are shown. The analyzer 110 shown in FIG. 4(A) is a small hand held battery powered device with a 5 inch touch screen display 114. The model 112 shown in FIG. 4(B) has a larger display 116 and includes the capability to be controlled by a computer either through a wireless or Ethernet connection. While the housings shown in FIGS. 4(A) and (B) are preferred, those skilled in the art will appreciate that the present invention could be embodied in a wide variety of designs.

Once the analyzers have recorded spectrum data, the analyzer units can be used to process and manipulate the stored data through a menu driven display. A signal list of detected signals is accessible through menus as well as trace file management functions to store, combine, merge, compare, edit, and manipulate spectrum trace files. Trace math functions can be selected to add, subtract, average, and apply math functions to the saved spectrum trace files. A screenshot capture mode is provided. Frequency and power measurement recording capability is available in the form of a single trace and recorded power measurement.

The analyzers preferably have software that provides for automatic identification of common commercial broadcast protocols such as Wi-Fi, Bluetooth, CDMA, 3G, LTE, etc. based on frequency spectrum, data rates, modulation formats, and other identifying characteristics. In addition, the analyzer units provide basic demodulation of AM and FM signals. An oscilloscope functionality and view is preferably available whenever the unit is zoomed to a desired frequency span within the instantaneous bandwidth of the receiver and the user has initiated audio demodulation. The units can also record short snippets of demodulated analog audio in their memory.

A spectrum analyzer of the present invention is preferably capable of operating in a number of different modes including a wide span sweep mode. In wide span sweep mode, the analyzer is used in a manner similar to a near field detector, by walking around an area looking at changes in the display to detect RF energy. The emphasis on this mode is for quick detection without providing detailed frequency or power information. In this mode, the display RF graph represents average or peak RF energy over a broad frequency span depending on the viewed frequency span and the graph resolution.

Figure 5:
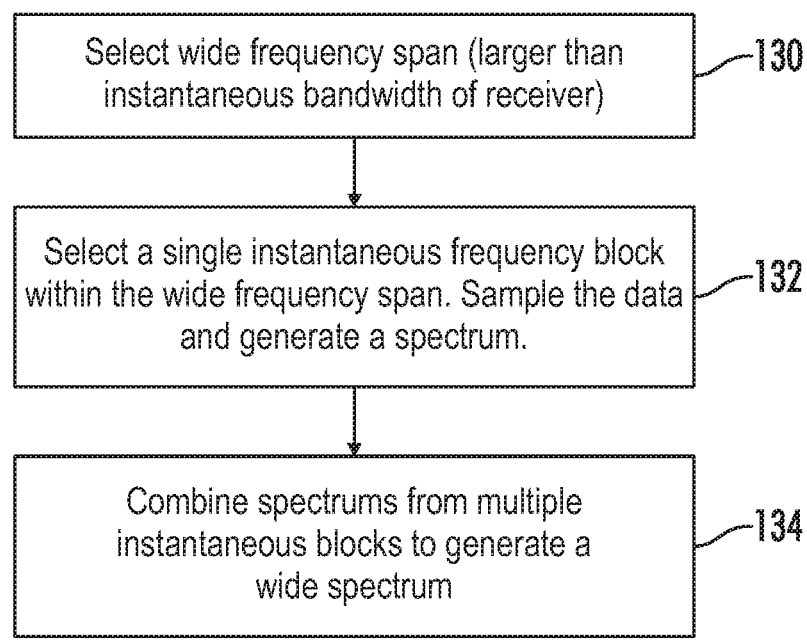
FIG. 5 is a flow chart of a wide span sweep mode of operation of a spectrum analyzer constructed in accordance with an embodiment of the present invention.

Referring now to FIG. 5, a flow chart of the wide span sweep mode of operation of a spectrum analyzer constructed in accordance with an embodiment of the present invention is shown. The method begins in step 130 with the selecting of a frequency range that is greater than the receiver instantaneous bandwidth. The analog receiver must scan this range by moving the front end analog receiver in fixed blocks that are equal to or less than the instantaneous bandwidth. In step 132, the analyzer samples and processes the time data within a single instantaneous bandwidth block of frequency to form a frequency spectrum of that block of frequency. The method finishes in step 134 with the combining of the frequency spectrums from multiple instantaneous blocks and the displaying of a graph of the resulting frequency spectrum data. As a result of the sampling time, instantaneous frequency bandwidth block size, and the wide span sweep mode sweeping function, the unit is not capable of providing real-time spectrum analyzer data for frequency spans greater than the instantaneous bandwidth. Details of the spectrum processing and the display update are a function of the frequency span and details are preferably provided below the displayed graph. The graphics display preferably incorporates a persistence type display to indicate continuous signals that may be masked by ambient time changing modulations.

The spectrum analyzer of this embodiment is also capable of operating in a wide span sweep detector mode of operation. The purpose of the wide span sweep detector mode is to provide the user with a quick assessment of the RF environment. In wide span sweep detector mode, the analyzer is sweeping a broad frequency range between 10 KHz and 6 GHz while the display shows a series of coarse bar graphs, preferably up to about 50. This graphic display depicts the RF energy across the viewed frequency span.

The graphic display preferably incorporates non-linear graphic techniques when displaying the frequency axis to provide a more user friendly view of the RF spectrum over a broad range. Typically, a spectrum analyzer will scan a wide frequency range that will have very few signals to display for large portions of the spectrum. The present invention preferably utilizes an algorithm to dynamically adjust the displayed frequency axis to graphically expand the frequency axis in areas with higher concentrations of signals (RF power) and a graphically condensed frequency axis for frequency ranges with little or no measurable RF energy.

Figure 6A:
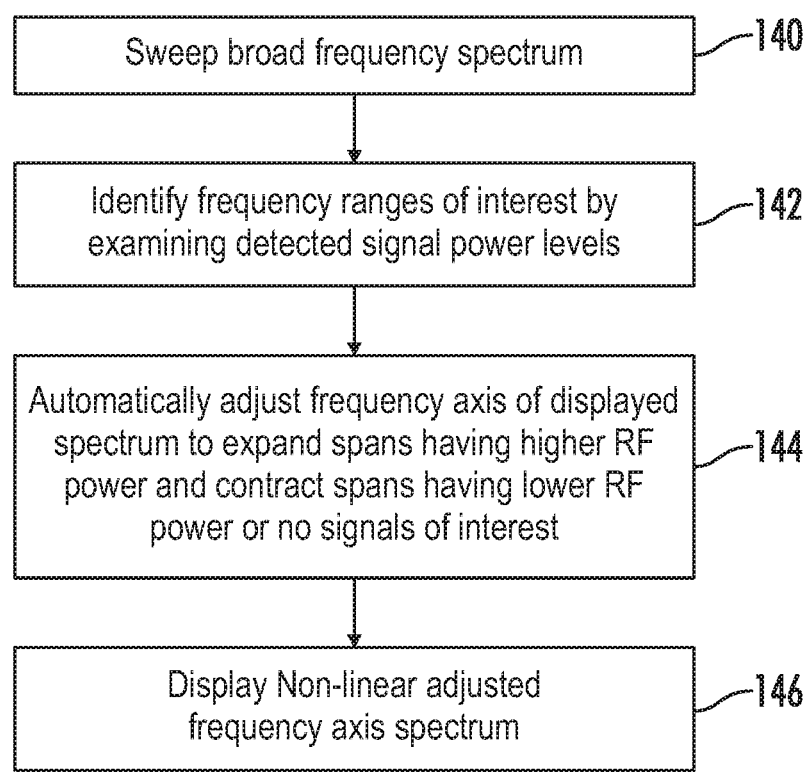
FIG. 6(A) is a flow chart of a non-linear display mode of operation of a spectrum analyzer constructed in accordance with an embodiment of the present invention.
Figure 6B:
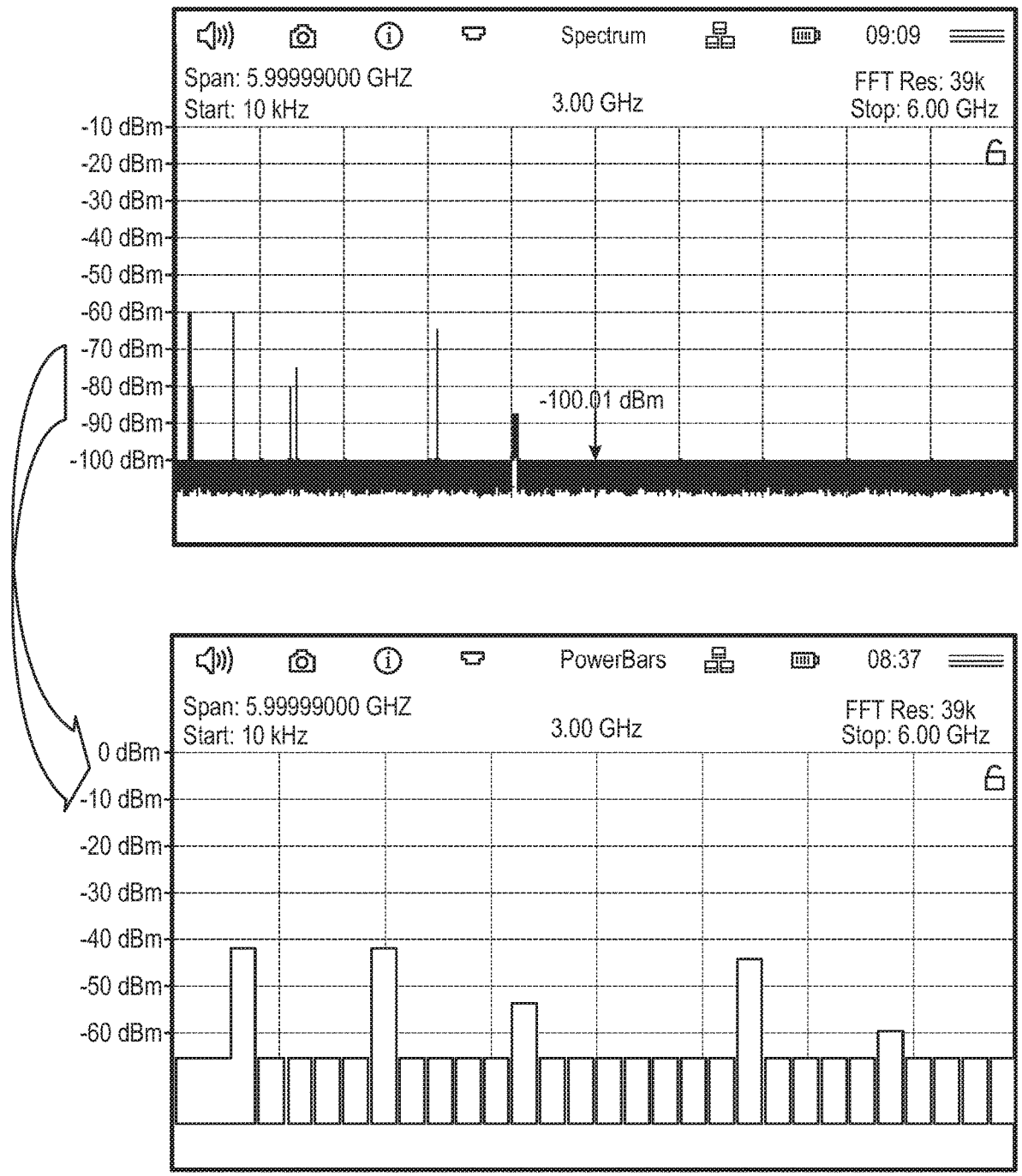
FIG. 6(B) is an example of a non-linear display created in accordance with the method of FIG. 6(A)

Referring now to FIG. 6(A), a flow chart of the non-linear display mode of operation of a spectrum analyzer constructed in accordance with an embodiment of the present invention is shown. The method begins in step 140 with the sweeping of a broad frequency spectrum. In step 142, frequency ranges having a high concentration of signals are identified by observing RF power levels in these ranges. In step, 144, the identified frequency ranges with higher RF power are then automatically expanded based on total RF energy within the range and any frequency ranges having no signals of interested (low RF power) are contracted. Finally, the frequency spectrum having a non-linear adjusted frequency axis is displayed for use by an operator of the analyzer as shown in step 146. An example 147 of a non-linear display created in accordance with the method of FIG. 6(A) is shown in FIG. 6(B).

In accordance with this type of display system, the horizontal axis is non-linear, which provides a big advantage for viewing signals with a small spectral display. As the user "zooms" into the smaller frequency spans, and the signals of interest expand with respect to the narrower displayed axis, the non-linear display effect is reduced proportionally to the point that the display is linear below a determined or specified frequency span.

Figure 7A:
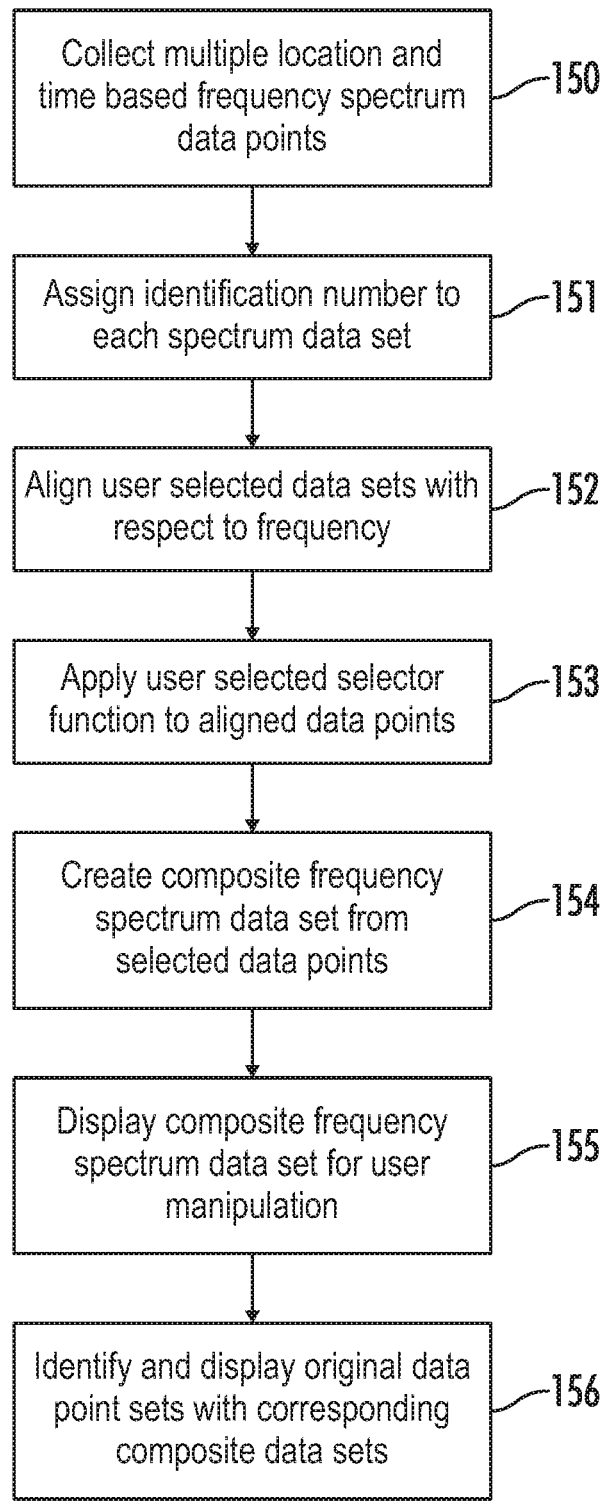
FIG. 7 (A) is a flow chart of a method of combining and organizing multiple sets of frequency data into a single composite data set for display in accordance with an embodiment of the present invention.
FIG. 7(B) is an example of how points in a composite data set created in accordance with the method of FIG. 7(A) may be indexed.
FIG. 7(C) is an example of a composite data set created in accordance with the method of FIG. 7(A) based on location.
FIG. 7(D) is an example of a composite data set created in accordance with the method of FIG. 7(A) based on time.
Figure 7B:
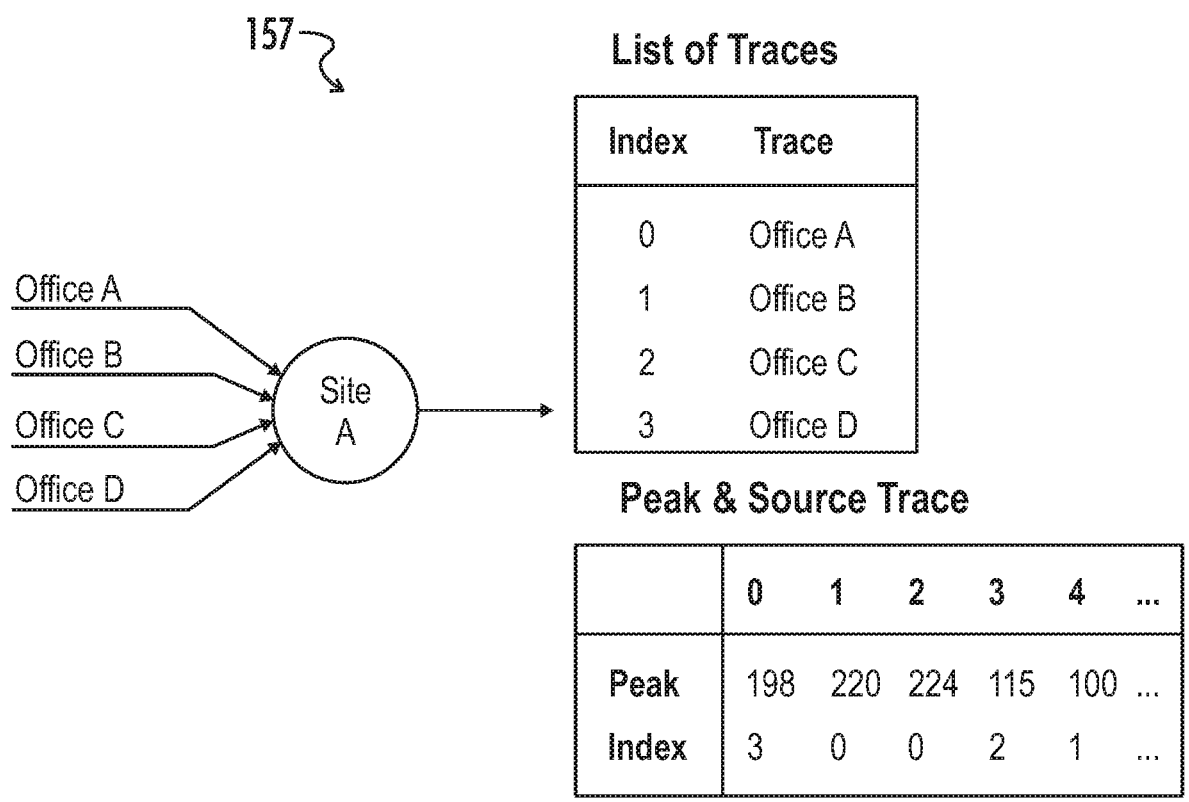
Figure 7C:
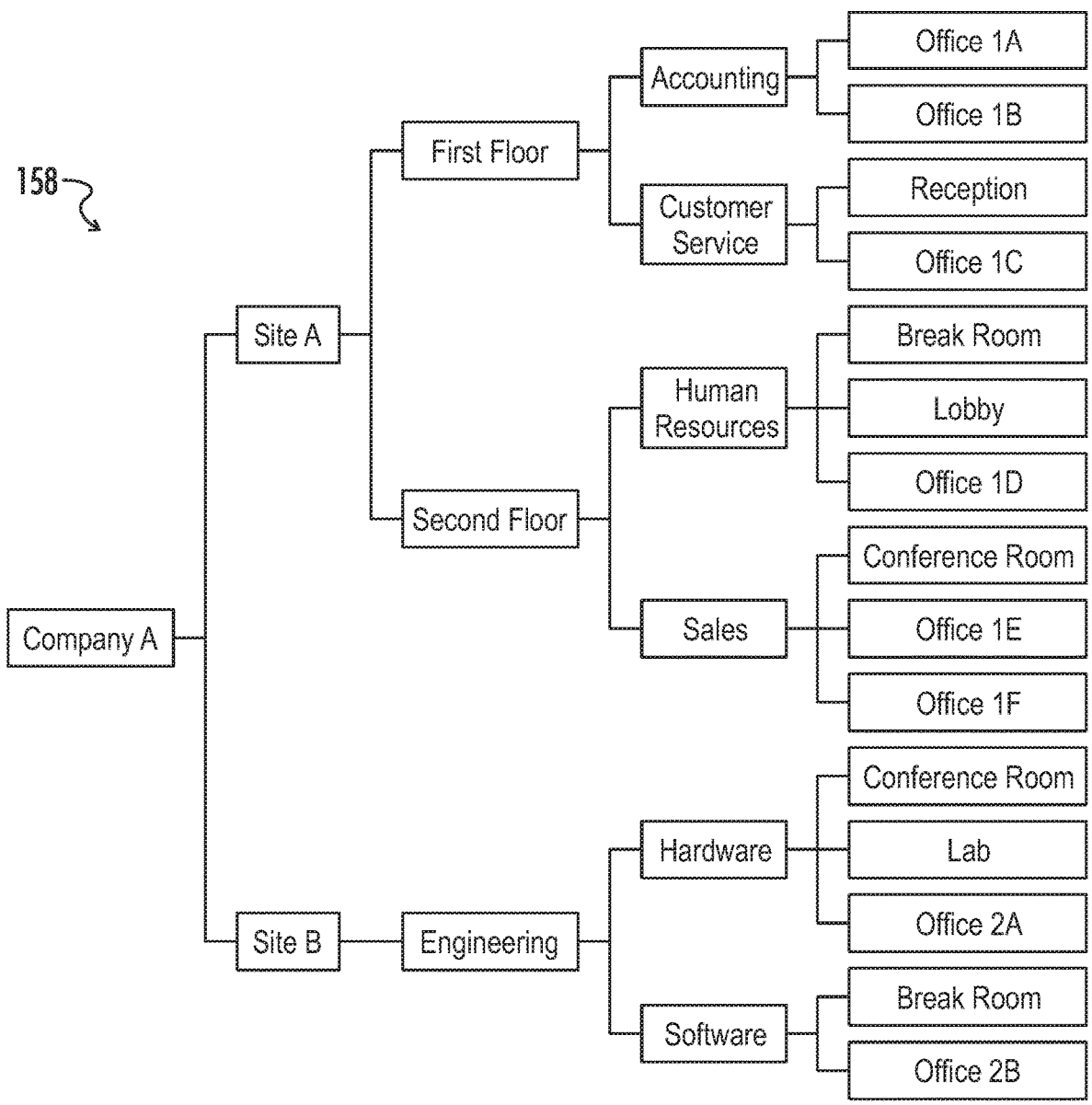
Figure 7D:
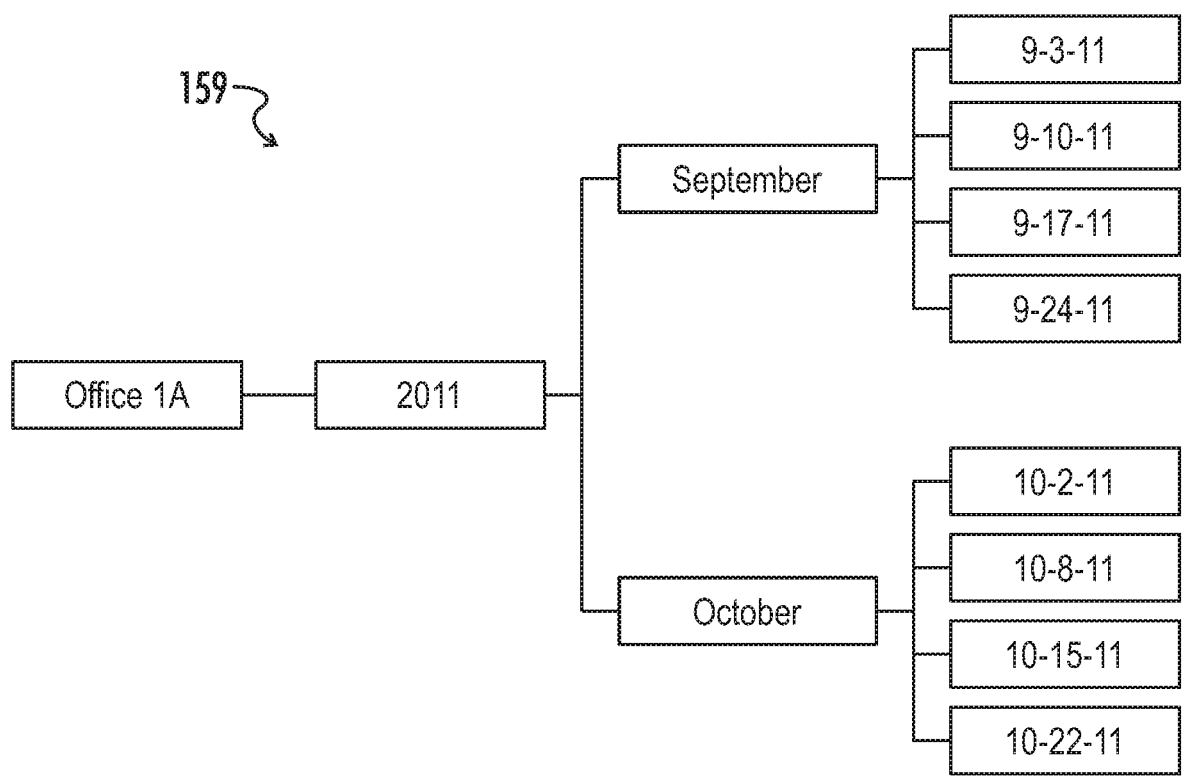

The present inventors have also developed a method of analyzing multiple spectrum traces from different times or locations. Referring now to FIG. 7(A), a method of combining and organizing multiple sets of data such as spectrum traces or time series data into a single composite data set for display is shown. The method begins in step 150 with the collecting of multiple frequency spectrum data sets from a number of different times and/or locations. Each data set is then assigned an identification number in step 151. In step 152, the data points of user selected data sets are aligned with respect to frequency. At each aligned index point, the data points for each data set are passed into a selector function as shown in step 153. The selector function returns a chosen data point and the identification number of the set that contains the data point based upon which one has the largest signal amplitude. In step 154, a new composite data set is created from the original set of data sets and the set of selected data points and set identification number pairs. The composite data set can then be displayed or manipulated as a single set of data, as shown in step 155 while allowing the original source data sets for each composite data value to be identified if desired as shown in step 156. An example 157 of the formation of such a composite trace is shown in FIG. 7(B). An example 158 of the formation of a location based composite data set is shown in FIG. 7(B). FIG. 7(D) is an example 159 of the formation of a time based composite data set. Those skilled in the art will appreciate that the examples of FIG. 7(A-C) are exemplary only and the actual data arrangements will depend upon the particular application.

A composite data set can be further composited to form a hierarchal tree-based structure where each node of the tree is a composite set and its set of sequences are branches. From the root composite set, it is possible to determine the original set for each value by traversing the selected data point/sequence identification number pairs through their corresponding sub-sequence until reaching a leaf node.

Figure 8:
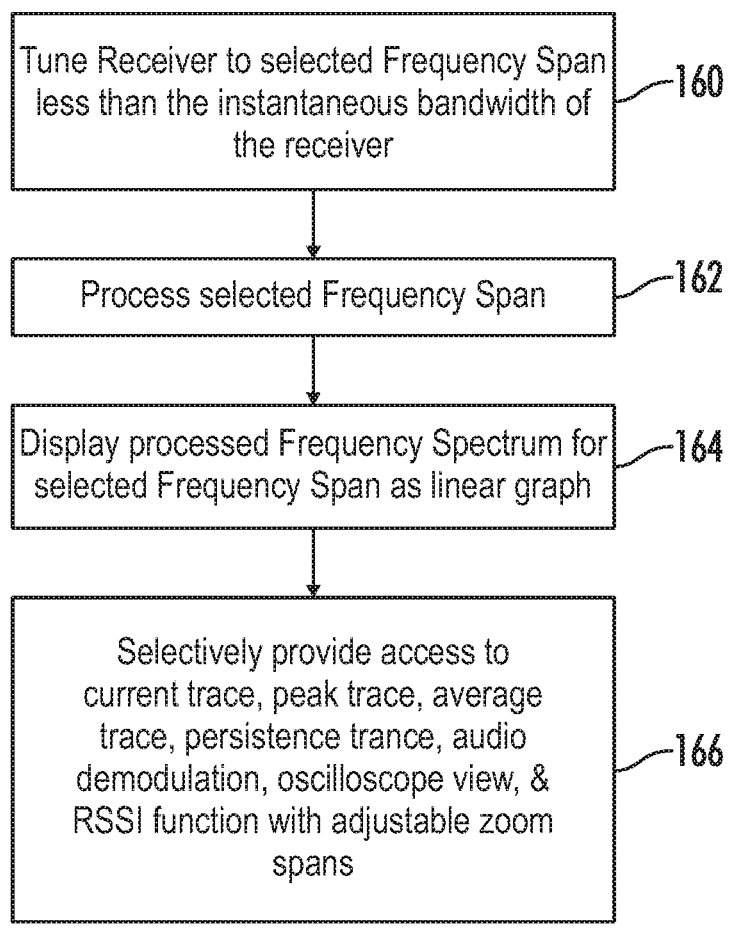
FIG. 8 is a flow chart of a signal inspection mode of operation of a spectrum analyzer constructed in accordance with an embodiment of the present invention.

Referring now to FIG. 8, a flow chart of a signal inspection mode of operation of a spectrum analyzer constructed in accordance with an embodiment of the present invention is shown. In signal inspection mode, the receiver is tuned to a selected span less than the instantaneous bandwidth of the receiver, step 160, the span is sampled and processed, step 162, and a spectral display is provided to the user in step 164. In signal inspection mode, the RF spectrum trace is displayed as a linear graph in a manner similar to a typical spectrum analyzer display.

A current trace, peak trace, average trace, persistence trace, audio demodulation, oscilloscope view, RSSI function, and spectrogram are preferably available for selection by the user in signal inspection mode as shown in step 166. When using the product as a stand-alone device such that it is not communicating with any other hardware, a spectrogram function is available in all modes. The spectrogram is a quick way to observe the RF spectrum over a period of time and easily identify intermittent transmissions while walking around an area. The spectrogram update rate may be user definable depending on the receiver scan speed and the processing capability. The spectrogram is a visual representation of the spectrum monitored by the device as it varies with time but is limited by the sampling duty cycles as described herein. Depending on the operating mode of the analyzer, the spectrogram may be stored at display resolution or at a minimum frequency resolution. A limited amount of data is buffered depending upon the amount of available memory. User selected spectrograms can be saved to external memory as desired. The persistence type display is helpful in identifying continuous signals that may be masked by ambient time changing modulations.

The main purpose of the signal inspection mode is to provide a spectrum analyzer view of the RF power spectral density of a signal. When desired for compliance and/or cost reasons, the sweeping function may be implemented such that the device is not capable of functioning as a real-time spectrum analyzer even when sweeping a single frequency block. Due to the limited bandwidth and sampling time, the duty cycle in such an embodiment may vary.

The spectrum analyzer may be connected to a PC computer or other central master device via wired or wireless means to operate in a controller mode. In controller mode, the individual analyzer units provide frequency and power information to a central controller device such as a PC or a designated spectrum analyzer unit which is capable of displaying frequency and power information from multiple units. Application software on the master controller captures data from the individual units. In essence, the controller mode enables "master/slave" operation whereby a computer or a designated analyzer unit serves as the master controller for multiple analyzer units. The master controller unit preferably synchronizes the sweeps from multiple units so that comparisons can be made from multiple units within a very accurate time frame. This is especially important when analyzing time changing modulations.

Figure 9:
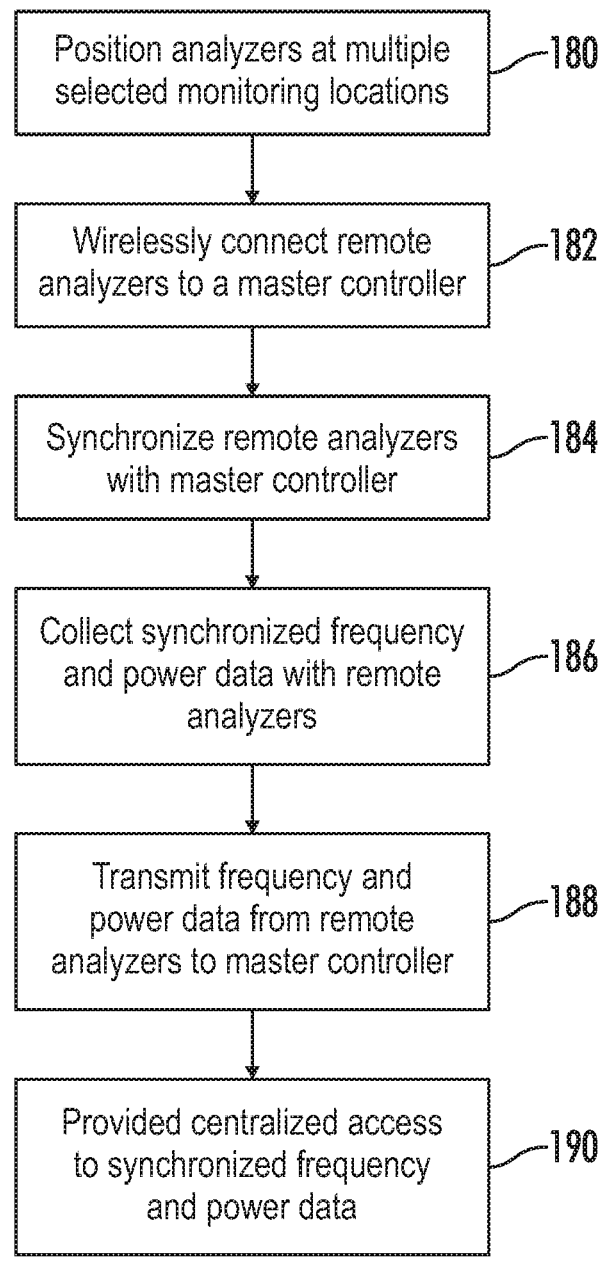
FIG. 9 is a flow chart of a controller mode of operation of a spectrum analyzer constructed in accordance with an embodiment of the present invention.

Referring now to FIG. 9, a flow chart of a master controller mode of operation of a spectrum analyzer constructed in accordance with an embodiment of the present invention is shown. The controller mode of operation begins in step 180 with the positioning of analyzers at multiple selected monitoring locations. In step 182, the remote analyzers are wirelessly connected to a master controller. While a wireless method of connection is preferred, those skilled in the art will appreciate that dedicated wiring can be used if desired. In step 184, the remote analyzers are synchronized with the master controller and, in step 186, synchronized frequency and power data is collected with the remote analyzers. In step 188, the frequency and power data from the remote analyzers is transmitted to the master controller. The method ends in step 190 with the provision of centralized access to the synchronized frequency and power data.

The controller mode of operation is intended to provide RF power level comparisons from different locations and remote sensors. Thus, the controller mode of operation is particularly useful when combined with a wireless communication technology such as Wi-Fi or Bluetooth. Using a wireless method of communication, the user can quickly go into an environment and place units at desired locations without the need to run wires or set up a communication network. When implemented in a wireless fashion, as a result of data transfer limitations, the remote analyzer units may be capable of processing sweep traces at a much faster rate than they can actually transfer data to the master controller. Therefore, in such situations, more detailed trace data may be stored at the individual analyzer units and, at the request of the master controller, additional detail or resolution may be transferred to the controller. Furthermore, each spectrum analyzer unit may function as a repeater for communications from other units. Therefore, a mesh radio approach may be used to transmit data from a distant unit back to the main controller by relaying the data through a series of slave units. Thus, the central master controller is able to display spectrum analyzer type information from multiple analyzer units spread over a large area without the need for increased communications transmit power.

When using the analyzers in a control mode of operation with analyzers connected to other external hardware such as a PC or spectrum analyzer, the analyzers are able to provide single peak trace updates to the connected hardware, with finer resolutions achievable for narrower resolution bandwidths. It is important to note that spectrum analyzer sweep duty cycle may be reduced when using wireless means of controlling the remote units. The primary reason for this limitation is that the analyzer receiver is not sweeping during the transmission of wireless data to the master controller. In the controller mode of operation, the PC or other connected hardware can build a spectrogram or waterfall image using these single traces received at time intervals from one or multiple devices. The spectrogram is a visual representation of the spectrum monitored by the device as it varies with time, but can be limited by the time and data constraints as described herein.

The analyzer units preferably have a capability to record I&Q data, or changes in signal magnitude and phase, over time. This I&Q recording time is limited to the instantaneous bandwidth of the unit. At full instantaneous bandwidth, the analyzers will have a recording time capability based on available memory and data recording rate. For narrower bandwidths, the recording time will increase proportionally. This recording limitation can be implemented by internal hardware and firmware to limit the product to commercial applications and render them substantially useless for intelligence and/or counter intelligence applications. The purpose of the recording function is to be able to capture a brief sample of a detected RF signal for further analysis and identification and to provide basic commercial signal identification functions without enabling intelligence gathering. Application software is also used to implement functions such as spectrum mask and trigger alert modes to provide warnings when RF levels exceed selected thresholds. These trigger alerts may be used to store a frequency and power trace, or initiate I&Q recording.

Figure 10:
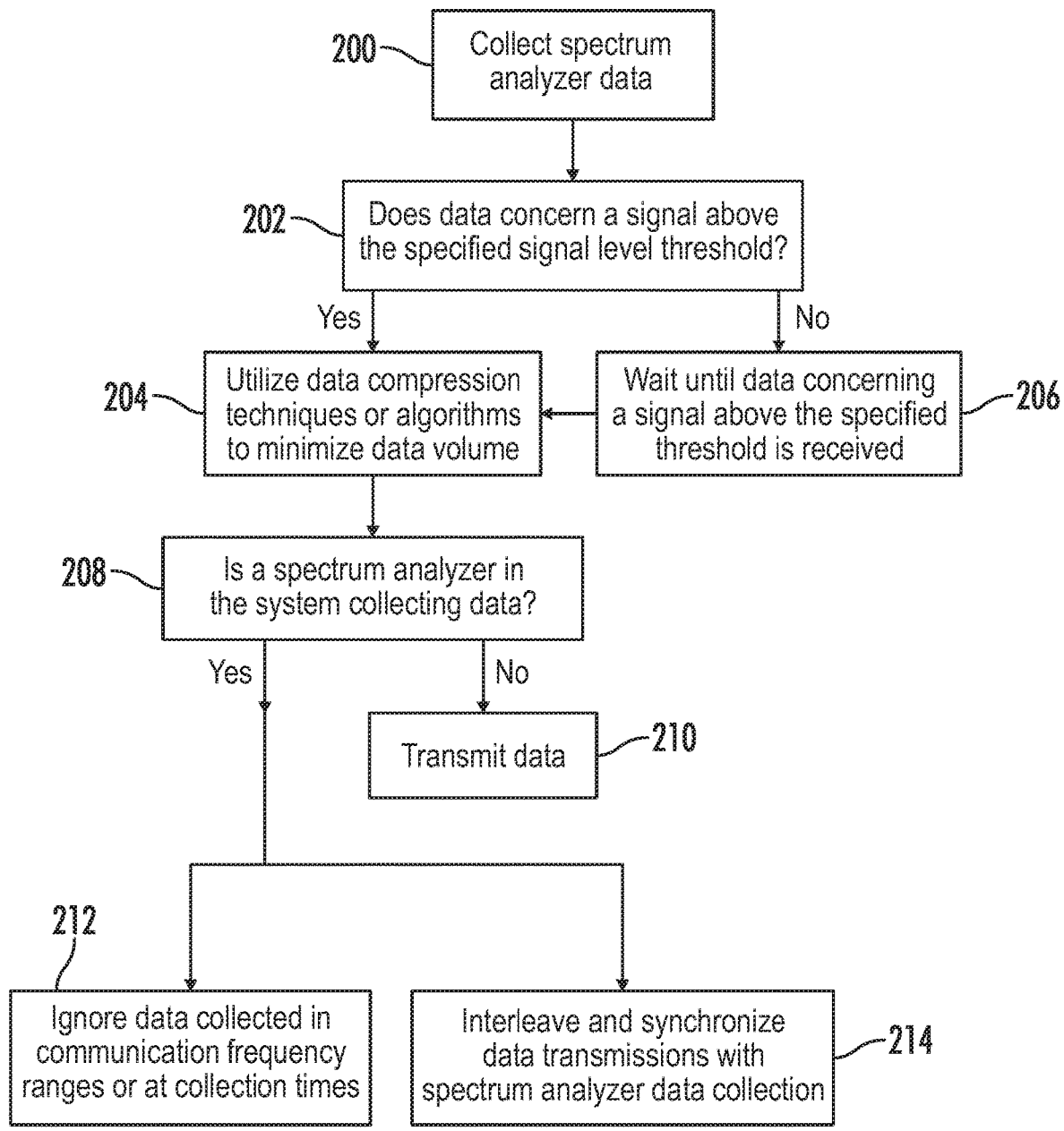
FIG. 10 is a flow chart of a method of collecting and communicating spectrum analyzer data with a spectrum analyzer in accordance with an embodiment of the present invention.

Referring now to FIG. 10, a flow chart of a method of collecting and communicating spectrum analyzer data with a spectrum analyzer in accordance with an embodiment of the present invention is shown. The method begins in step 200 with the collecting of spectrum analyzer data. Once the data is collected by a spectrum analyzer the collected data must be transmitted to the master controller device. To limit the amount of data transmitted, certain portions of the collected data may not be transmitted to the master controller. In step 202, the method determines if the collected data concerns a signal that is above a specified signal level threshold. Only data about signals above the threshold level is transmitted which greatly reduces the transmitted data volume. If a signal above the threshold level has not been detected, the method waits until data concerning a signal above the specified threshold is received in step 206. In step 208, communications data compression techniques or algorithms are used to minimize the transmitted data volume for improved communications.

There are many ways to deal with the fact that the spectrum analyzer's sweeping the frequency spectrum and will inadvertently capture RF energy associated with the wireless data communications. In step 208, the method determines if a spectrum analyzer in the system is collecting data. If no spectrum analyzer is collecting data, the method proceeds to step 210 and transmits the data. If a analyzer is collecting data, to not corrupt the monitored RF spectrum, the wireless transmission is halted while the spectrum analyzers collect spectrum data so that the wireless transmission does not appear in the spectrum data. In this communications scenario the master/slave communication must be interleaved and synchronized with the spectrum analyzer sweeping functions, as shown in step 214 so that the spectrum analyzers may monitor the true frequency spectrum without detecting the master/slave communications.

Alternatively, as shown in step 212, the spectrum analyzer may continue sweeping and simply ignore data associated with the times and/or frequency ranges where the spectrum analyzer is receiving its wireless communications. This method provides the advantage of not having to coordinate synchronization and reestablishment of the communications activity while maintaining a much higher update rate of the bulk of the RF spectrum. Also, using this approach, the communications may be halted periodically simply to allow the spectrum analyzer to sweep the associated communications frequency range for comparison. In summary, there are many approaches and algorithms that may be implemented to accomplish this wireless communications while maintaining an RF sweep of the spectrum. The chosen algorithm will depend on many factors including the sweep speed, frequency resolution, data volume, data compression, and desired update rate.

Although there have been described particular embodiments of the present invention of Improved Data Management with Spectrum Analyzers, it is not intended that such references be construed as limitations upon the scope of this invention except as set forth in the following claims.

What is claimed is:

1. A method of collecting and communicating spectrum analyzer data with a spectrum analyzer, said method comprising:
   designating a computer as a spectrum analyzer controller;
   designating at least one spectrum analyzer as a spectrum monitoring device; and
   communicating spectrum analyzer data concerning radio frequency transmission signals detected in a monitored frequency span by said spectrum monitoring device to said spectrum analyzer controller using wireless communication;
   wherein said wireless communication is accomplished by interleaving and synchronizing communications between said spectrum monitoring device and said spectrum analyzer controller with spectrum analyzer data collection functions to avoid overlapping wireless communications with said spectrum analyzer data collection functions.

2. The method of claim 1 wherein said spectrum analyzer utilizes data compression techniques or algorithms to reduce a transmitted data volume.

3. The method of claim 1 wherein said wireless communication is temporarily halted for the purpose of sweeping a frequency range associated with said wireless communication.

4. The method of claim 1 wherein the spectrum analyzer controller wirelessly communicates with multiple remote spectrum analyzers designated as spectrum monitoring devices.

5. The method of claim 1 wherein said spectrum analyzer data further comprises spectrum trace data.

6. The method of claim 1 wherein said spectrum analyzer data further comprises I&Q data.

7. The method of claim 1 wherein said computer further comprises a spectrum analyzer capable of functioning as a spectrum analyzer controller.

8. The method of claim 1 further comprising the step of transmitting and receiving wireless communications with a specified spectrum monitoring device by using at least one or more spectrum monitoring devices to relay or repeat wireless communications from said specified spectrum monitoring device to said spectrum analyzer controller.

9. A method of collecting and communicating spectrum analyzer data, said method comprising:
   communicating spectrum analyzer data concerning radio frequency transmission signals detected in a monitored frequency span by a first spectrum analyzer to a second spectrum analyzer using wireless communication by interleaving and synchronizing communications between the first spectrum analyzer and the second spectrum analyzer with spectrum analyzer data collection functions to avoid overlapping wireless communications with said spectrum analyzer data collection functions;
   wherein said wireless communication is accomplished by conducting said wireless communication and spectrum analyzer sweeping simultaneously and ignoring sampling times or frequency ranges where spectrum analyzer data may include wireless communication interference.

10. The method of claim 9 wherein said first spectrum analyzer utilizes data compression techniques or algorithms to reduce a transmitted data volume.

11. The method of claim 9 wherein said wireless communication is temporarily halted for the purpose of sweeping a frequency range associated with said wireless communication.

12. The method of claim 9 wherein one of the first and second spectrum analyzers is a master controller device that wirelessly communicates with multiple remote spectrum analyzers.

13. The method of claim 9 wherein said spectrum analyzer data further comprises spectrum trace data.

14. The method of claim 9 wherein said spectrum analyzer data further comprises I&Q data.

15. The method of claim 9 further comprising the step of transmitting and receiving wireless communications with a spectrum analyzer designated as a master controller by using at least one or more remote spectrum analyzers to relay or repeat wireless communications from another remote spectrum analyzer to said master controller.

16. A system for collecting and communicating spectrum analyzer data, said system comprising:
   a first spectrum analyzer that collects spectrum analyzer data concerning radio frequency transmission signals detected in a monitored frequency span;
   a second spectrum analyzer;
   wherein the first spectrum analyzer communicates spectrum analyzer data concerning radio frequency transmission signals detected by the first spectrum analyzer to the second spectrum analyzer using wireless communication by interleaving and synchronizing communications between the first spectrum analyzer and the second spectrum analyzer with spectrum analyzer data collection functions to avoid overlapping wireless communications with said spectrum analyzer data collection functions.

17. The system of claim 16 wherein said first spectrum analyzer utilizes data compression techniques or algorithms to reduce a transmitted data volume.

18. The system of claim 16 wherein said wireless communication is temporarily halted for the purpose of sweeping a frequency range associated with said wireless communication.

19. The system of claim 16 wherein the second spectrum analyzers is a master controller device that wirelessly communicates with multiple remote spectrum analyzers.

20. The system of claim 16 wherein said wireless communication is accomplished by using at least one or more remote spectrum analyzers to relay or repeat wireless communications from another remote spectrum analyzer to a spectrum analyzer designated as a master controller.

* * * * *